United States Patent
Lee et al.

(10) Patent No.: US 9,343,370 B1
(45) Date of Patent: May 17, 2016

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Dong-Seok Lee, Incheon (KR); Kang-Ill Seo, Chungcheongbuk-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/555,775

(22) Filed: Nov. 28, 2014

(51) Int. Cl.
| | |
|---|---|
| *H01L 21/308* | (2006.01) |
| *H01L 21/8234* | (2006.01) |
| *H01L 21/762* | (2006.01) |
| *H01L 21/311* | (2006.01) |
| *H01L 21/3065* | (2006.01) |
| *H01L 21/306* | (2006.01) |

(52) U.S. Cl.
CPC ...... *H01L 21/823431* (2013.01); *H01L 21/308* (2013.01); *H01L 21/3065* (2013.01); *H01L 21/3083* (2013.01); *H01L 21/30604* (2013.01); *H01L 21/31144* (2013.01); *H01L 21/76224* (2013.01); *H01L 21/823481* (2013.01)

(58) Field of Classification Search
CPC ............ H01L 21/3213; H01L 21/8232
See application file for complete search history.

(56) References Cited

U.S. PATENT DOCUMENTS

| | | | |
|---|---|---|---|
| 7,534,686 | B2 | 5/2009 | Lee et al. |
| 7,843,000 | B2 | 11/2010 | Yu et al. |
| 8,354,320 | B1 | 1/2013 | Xie et al. |
| 2008/0061383 | A1 | 3/2008 | Kawakita |
| 2013/0056826 | A1 | 3/2013 | Liu et al. |
| 2013/0221448 | A1 | 8/2013 | Chang et al. |
| 2013/0244392 | A1 | 9/2013 | Oh et al. |

*Primary Examiner* — Cheung Lee
(74) *Attorney, Agent, or Firm* — F. Chau & Associates, LLC

(57) ABSTRACT

An exemplary method of fabricating a semiconductor device is provided. First and second hard mask patterns adjacent to each other are formed on a substrate. First and second active fins are formed by etching the substrate using the first and second hard mask patterns as a etch mask. An isolation layer is formed to fill a region defined by the first and second active fins and the first and second hard mask patterns. A mask pattern is formed to be positioned on the first hard mask pattern and overlap the first active fin. A first trench is formed by etching a portion of the isolation layer and a portion of the second active fin using the mask pattern as an etch mask. The remaining portion of the second active fin is removed by performing an isotropic etching process.

20 Claims, 28 Drawing Sheets

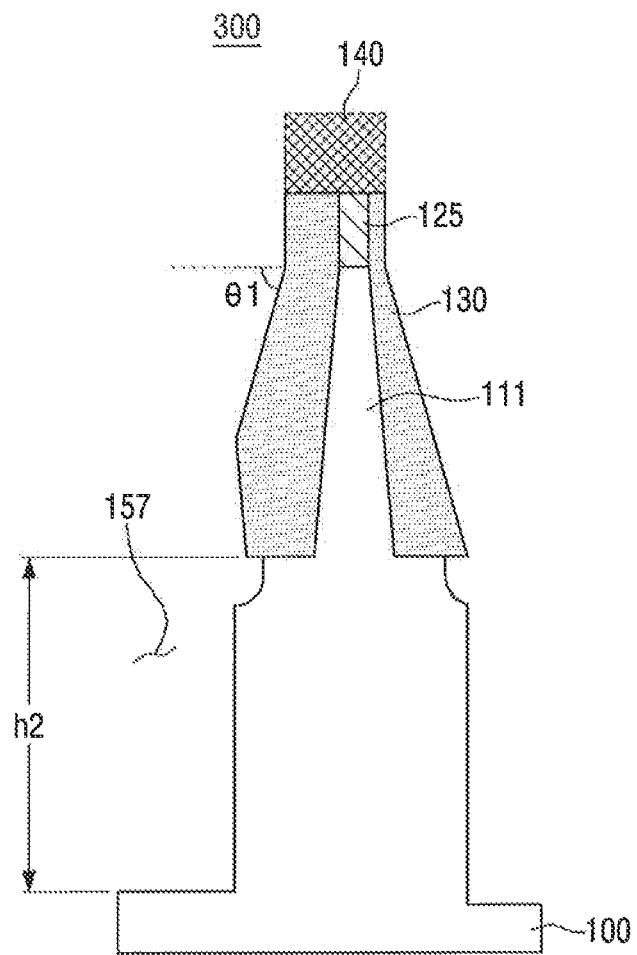

FIG. 11

| α | 0 | 1 | 2 | 3 | 4 | 5 |
|---|---|---|---|---|---|---|
| x | 3.7 | 3.3 | 3.0 | 2.7 | 2.3 | 2.0 |
| y | -69.8 | -63.5 | -57.1 | -50.8 | -44.4 | -38.1 |
| xt | 0.5 | -0.5 | -1.5 | -2.5 | -3.5 | -4.5 |
| Lateral etch target | 4.8 | 5.8 | 6.8 | 7.8 | 8.8 | 9.8 |

| α | 6 | 7 | 8 | 9 | 10 | 11 |
|---|---|---|---|---|---|---|
| x | 1.7 | 1.3 | 1.0 | 0.7 | 0.3 | 0.0 |
| y | -31.7 | -25.4 | -19.0 | -12.7 | -6.3 | 0.0 |
| xt | -5.5 | -6.5 | -7.5 | -8.5 | -9.5 | -10.5 |
| Lateral etch target | 10.8 | 11.8 | 12.8 | 13.8 | 14.8 | 15.8 |

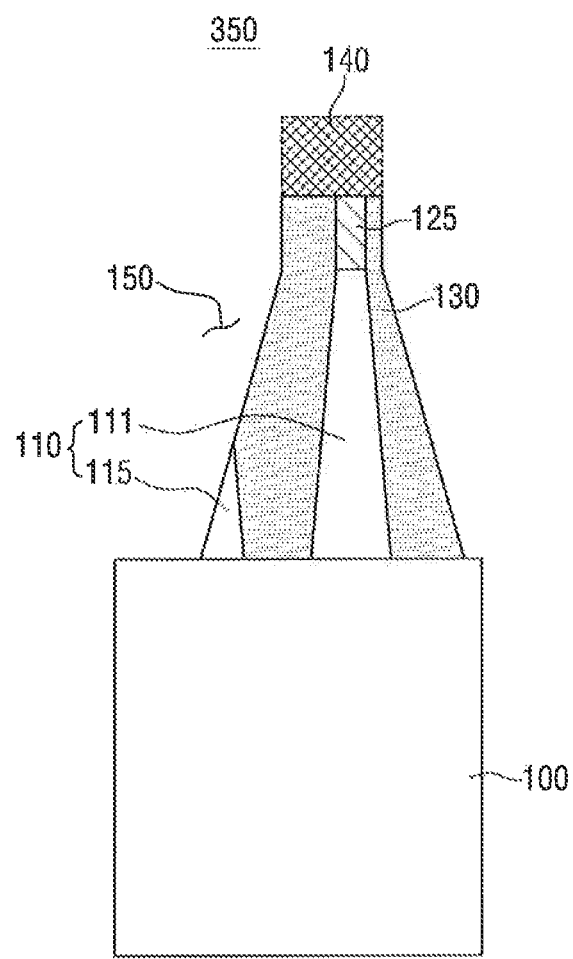

METHOD FOR FABRICATING SEMICONDUCTOR DEVICE

TECHNICAL FIELD

The present inventive concept relates to a method for fabricating a semiconductor device.

DISCUSSION OF RELATED ART

As semiconductor devices become more densely integrated, field effect transistors (FETs) are more prone to short channel effect (SCE). To reduce SCE, multi-gate transistors (or FinFETs) have been proposed.

SUMMARY

According to an exemplary embodiment of the present inventive concept, first and second hard mask patterns adjacent to each other are formed on a substrate. First and second active fins are formed by etching the substrate using the first and second hard mask patterns as a etch mask. An isolation layer is formed to fill a region defined by the first and second active fins and the first and second hard mask patterns. A mask pattern is formed to be positioned on the first hard mask pattern and overlap the first active fin. A first trench is formed by etching a portion of the isolation layer and a portion of the second active fin using the mask pattern as an etch mask. The remaining portion of the second active fin is removed by performing an isotropic etching process.

According to an exemplary embodiment of the present inventive concept, a plurality of active fins is formed on first and second regions of a substrate. A hard mask pattern is disposed on top surfaces of the plurality of active fins. An isolation layer is formed to fill a region disposed between two neighboring active fins of the plurality of active fins. A first mask pattern including a plurality of first line patterns, a first opening, a plurality of second line patterns and a second opening is formed. The plurality of first line patterns and the first opening are disposed on the first region. The first opening is disposed between two neighboring first line patterns of the plurality of first line patterns. The plurality of second line patterns and the second opening are disposed on the second region. The second opening is disposed between two neighboring second line patterns of the plurality of second line patterns. The plurality of first and second line patterns is positioned on the hard mask pattern. The plurality of first line patterns overlaps first portions of the plurality of active fins and the first opening overlaps second portions of the plurality of active fins. The plurality of second line patterns overlaps third portions of the plurality of active fins and the second opening overlaps fourth portions of the plurality of active fins. First and second trenches are formed by partially etching the second and fourth portions of the plurality of active fins using the first mask pattern as an etch mask. The first and second trenches are formed on the first and second regions, respectively. The second and the fourth portions of the plurality of active fins remaining after the forming of the first and the second trench are removed by an isotropic etching process. A second mask pattern covering the second region is formed. A third trench is formed through the first trench by an anisotropic etching process using the first mask pattern and the second mask pattern as a etch mask.

According to an exemplary embodiment of the present inventive concept, a plurality of first active fins and a plurality of second active fins are formed on a substrate. A mask pattern including a plurality of line patterns and a plurality of opening is formed. Each opening is disposed between two neighboring line patterns of the plurality of line patterns. Each line pattern overlaps each first active fin and each opening overlaps each second active fin. A plurality of first trenches is formed by partially etching, using the mask pattern as a etch mask, the plurality of second active fins. The plurality of first active fins is not etched in the forming of the plurality of first trenches. The remaining portion of each second active fin is removed using an isotropic etching process.

BRIEF DESCRIPTION OF THE DRAWINGS

These and other features of the inventive concept will become more apparent by describing in detail exemplary embodiments thereof with reference to the accompanying drawings of which:

FIGS. 1 to 7, FIGS. 8A to 8C, and FIGS. 9 to 11 illustrate intermediate process steps for a method for fabricating a semiconductor device according to an exemplary embodiment of the present inventive concept;

FIGS. 13A to 13C illustrate intermediate process steps for a method for fabricating a semiconductor device according to an exemplary embodiment of the present inventive concept;

DETAILED DESCRIPTION OF EXEMPLARY EMBODIMENTS

Figure 1:
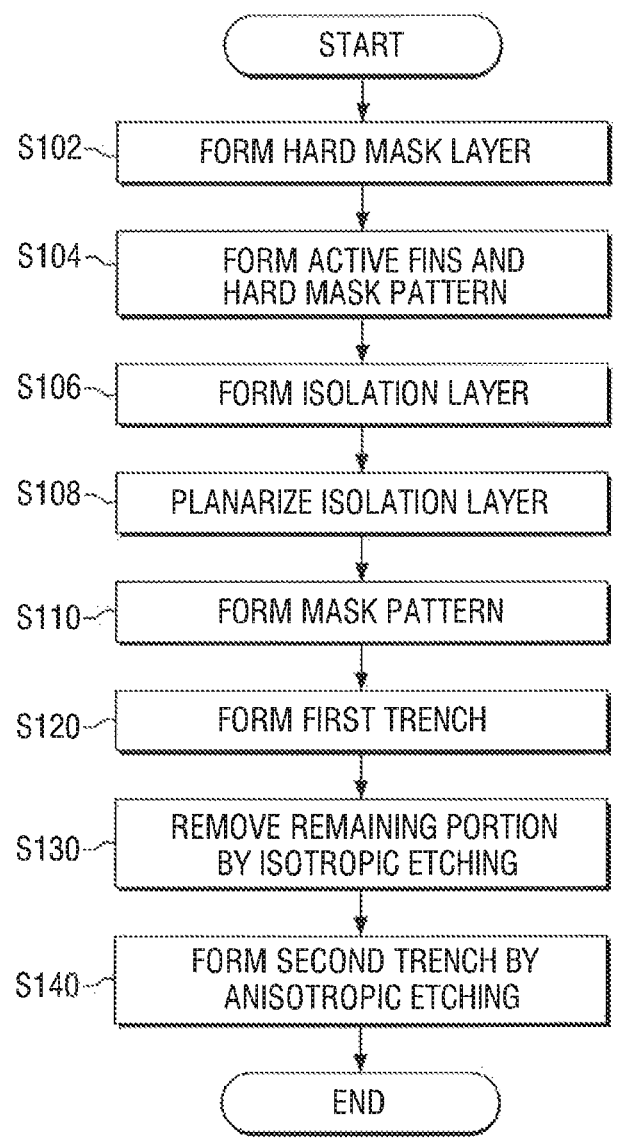
FIG. 1 is a flowchart illustrating a method for fabricating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a method for fabricating a semiconductor device according to an exemplary embodiment of the present inventive concept will be described with reference to FIGS. 1 to 11.

FIG. 1 is a flowchart illustrating a method for fabricating a semiconductor device according to an exemplary embodiment of the present inventive concept. FIGS. 2 to 11 illustrate intermediate process steps for a method for fabricating a semiconductor device according to an exemplary embodiment of the present inventive concept.

Figure 2:
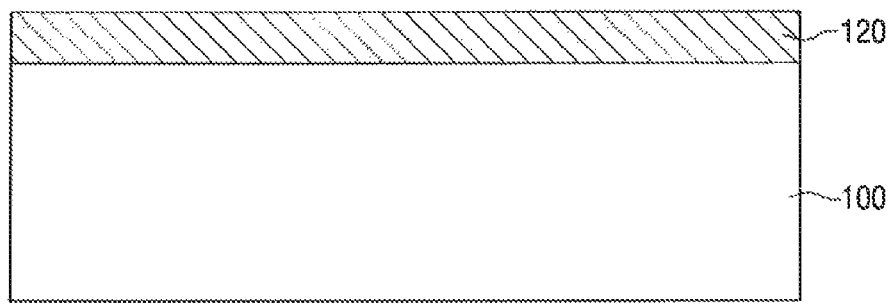

Referring to FIGS. 1 and 2, a hard mask layer 120 is formed on a substrate 100 (S102).

For example, the substrate 100 includes at least one of Si, Ge, SiGe, GaP, GaAs, SiC, SiGeC, InAs and InP. Alternatively, the substrate 100 includes a silicon on insulator (SOI) substrate.

The hard mask layer 120 includes a material having etching selectivity with respect to the substrate 100. For example, the hard mask layer 120 includes silicon, a metal-based material or a carbon-based material. The hard mask layer 120 includes at least one of polycrystalline silicon (poly Si), amorphous silicon (a-Si), titanium (Ti), titanium nitride (TiN), tantalum nitride (TaN), silicon oxide (SiO2), silicon oxynitride (SiON) and a combination thereof, but aspects of the present inventive concept are not limited thereto.

Figure 3:
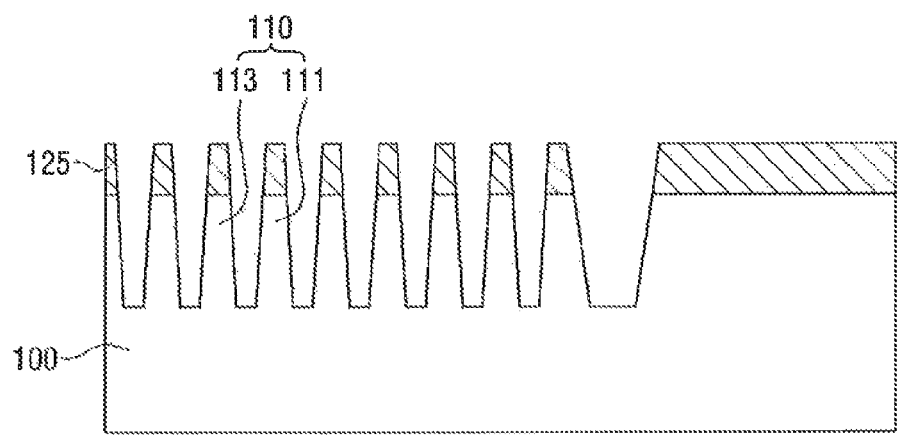

Referring to FIGS. 1 and 3, a plurality of active fins 110 and a hard mask pattern 125 are formed by etching the substrate 100 and the hard mask layer 120 (S104).

For example, a photoresist pattern (not shown) is formed on the hard mask layer 120 and the hard mask layer 120 is patterned using the photoresist pattern as an etch mask, thereby forming the plurality of active fins 110 and the hard mask pattern 125 on the substrate 100 shown in FIG. 3. The plurality of active fins 110 includes a first active fin 111 and a second active fin 113 adjacent to the first active fin 111. The hard mask pattern 125 is in contact with top surfaces of the plurality of active fins 110.

The active fins 110 may be used in fabricating multi-gate transistors (also known as FinFETs), but aspects of the present inventive concept are not limited thereto.

The hard mask pattern 125 may be formed using the photoresist pattern (not shown) on the substrate 100 as an etch mask. Next, the substrate 100 is etched using the hard mask pattern 125 as an etch mask, thereby forming the plurality of active fins 110 protruding from a top surface of the substrate 100 and integrally formed with the substrate 100, but aspects of the present inventive concept are not limited thereto. The substrate 100 and the plurality of active fins 110 may include materials having different selective etch rates from each other.

Figure 4:
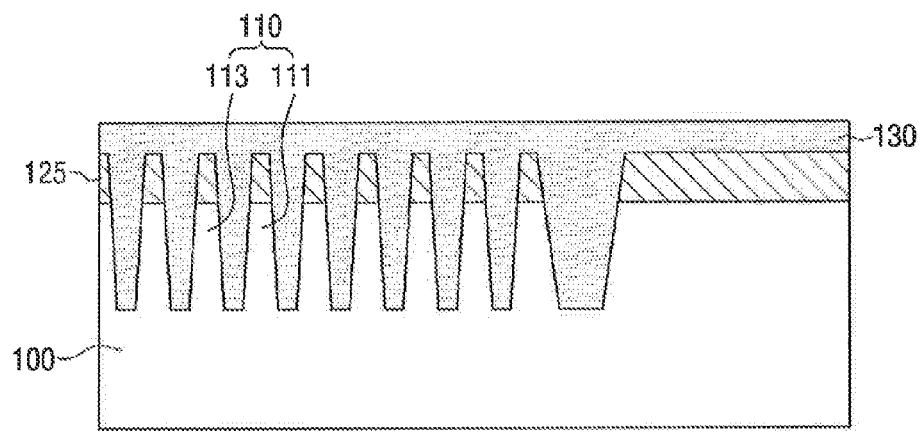

Referring to FIGS. 1 and 4, an isolation layer 130 is then formed (S106). The isolation layer 130 is formed to fill lateral surfaces of the plurality of active fins 110 and the hard mask pattern 125.

For example, the isolation layer 130 is formed on the substrate 100 to cover the plurality of active fins 110 and the hard mask pattern 125. Here, the isolation layer 130 may include an insulating oxide layer for isolating the plurality of active fins 110 from one another. The insulating oxide layer may include at least one of $HfO_2$, $ZrO_2$, $Ta_2O_5$, $TiO_2$, $SrTiO_3$ and $(Ba, Sr)TiO_3$, but aspects of the present inventive concept are not limited thereto.

Figure 5:
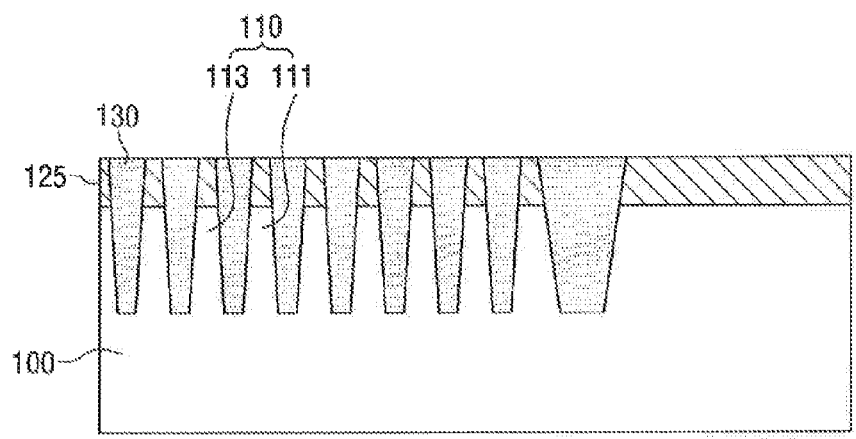

Referring to FIGS. 1 and 5, the isolation layer 130 is planarized (S108). For example, the isolation layer 130 may be planarized such that the hard mask pattern 125 is exposed. For example, the planarizing may be performed using a chemical mechanical polishing (CMP) process.

Figure 6:
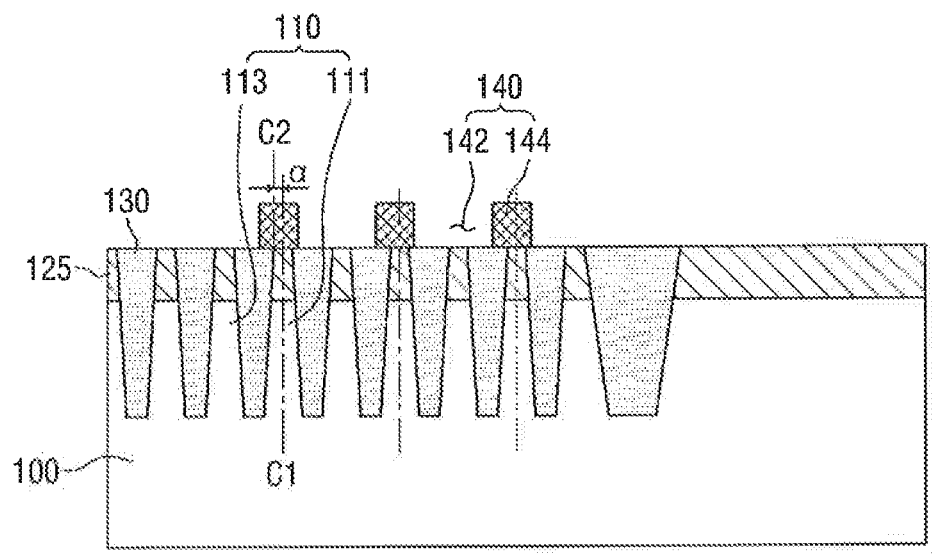

Referring to FIGS. 1 and 6, a mask pattern 140 is formed (S110). The mask pattern 140 is positioned on the hard mask pattern 125, partially overlapping the first active fin 111. The mask pattern 140 completely overlaps the first active fin 111 while not overlapping the second active fin 113.

For example, the mask pattern 140 completely overlaps one of the plurality of active fins 110. The mask pattern 140 includes a plurality of line patterns 144 and a plurality of openings 142 extending along the first active fin 111 in parallel to one another. One of the plurality of line patterns 144 completely overlaps one of the plurality of active fins 110. The plurality of openings 142 and the plurality of line patterns 144 are alternately arranged, and some of the plurality of active fins 110 are completely exposed. Aspects of the present inventive concept are not limited thereto. For example, the mask pattern 140 may completely overlap the plurality of active fins 110.

A centerline C2 of the mask pattern 140 need not coincide with a centerline C1 of the first active fin 111. For example, the centerline C2 of the mask pattern 140 and the centerline C1 of the first active fin 111 are spaced apart from each other at a distance a, which will later be described.

Figure 7:
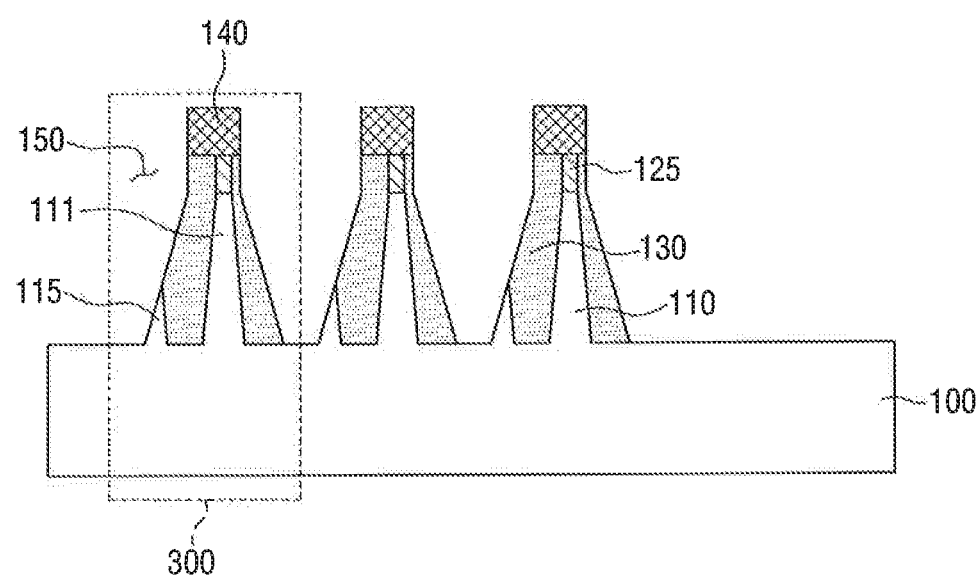

Referring to FIGS. 1 and 7, a first trench 150 is formed using the mask pattern 140 as an etch mask (S120). The first trench 150 is formed by etching the isolation layer 130 and the second active fin 113. The first trench 150 exposes the top surface of the substrate 100. Here, the second active fin 113 need not be completely etched. For example, the second active fin 113 is partially etched so that a remaining portion 115 of the second active fin 113 remains after the forming of the first trench 150.

Figure 8A:
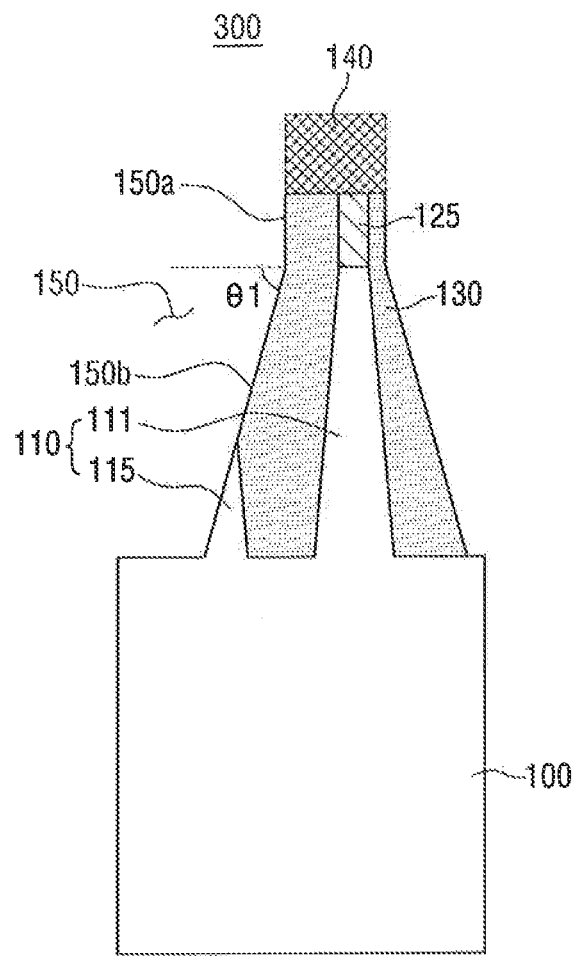
Figure 8B:
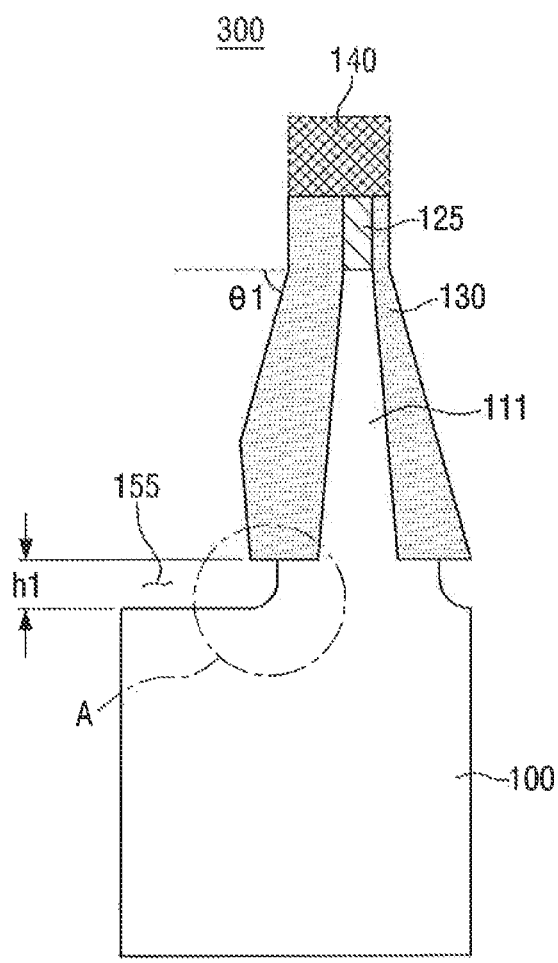

FIGS. 8A to 8C are enlarged views of a first region 300 of FIG. 7.

Referring to FIG. 8A, the first trench 150 is formed to include a vertical sidewall 150a and a sloped sidewall 150b. The sloped sidewall 150a is adjacent to the hard mask pattern 125. The sloped sidewall 150b is adjacent to the isolation layer 130. The sloped sidewall 150b is sloped at a first angle θ1 with respect to an imaginary line perpendicular to the vertical sidewall 150a. The area of the first trench 150 decreases downwardly toward a lower portion of the first active fin 111.

The sloped sidewall 150b extends from a top end of the first active fin 111 to a bottom end of the second active fin (113 of FIG. 6) at the first angle θ1. For example, the first angle θ1 may be an acute angle or a right angle.

In step S120 in which the isolation layer 130 and the second active fin 113 are etched using the mask pattern 140 as an etch mask, the isolation layer 130 and the second active fin 113 are etched with the slope of the first angle θ1, rather than being perpendicularly etched, the remaining portion 115 of the second active fin 113 is not produced if a width of the opening 142 is wide. If the width of the opening 142 is small, the remaining portion 115 of the second active fin 113 may be produced after the forming of the trench 150. When a fin pitch (distance) between two neighboring active fins 110 is reduced, the width of the opening 142 may be small such that the sloped sidewall 150b extending from the top end of the first active fin 111 to the bottom end of the second active fin 113 is formed in the process of forming the trench 150. For example, when the fin pitch of the active fins 110 is about 40 nm or less, the remaining portion 115 may be produced after the formation of the trench 150. The fin pitch may vary according to a process condition of forming the trench 150.

The remaining portion 115 remains in the form of a spike. The remaining portion 115 corresponds to a defect of a semiconductor product, adversely affecting the performance of the semiconductor product and lowering the reliability of the semiconductor product.

The remaining portion 115 may have a dimension of about 20 nm or less, but aspects of the present inventive concept are not limited thereto.

Referring to FIGS. 1 and 8B, the remaining portion 115 is removed by isotropic etching (S130). The isotropic etching may be performed prior to anisotropic etching, but aspects of the present inventive concept are not limited thereto. Rather, the anisotropic etching may be performed prior to isotropic etching, which will later be described.

Referring to FIG. 8B, the top surface of the exposed substrate 100 is isotropically etched, thereby forming a round recess under the isolation layer 130. As the result of the isotropic etching, an undercut region is formed on the substrate 100 positioned under the isolation layer 130.

When the substrate 100 and the active fins 110 are made of the same material, the substrate 100 is etched by the isotropic etching to a predetermined depth h1. The remaining portion 115 of the second active fin 113 is completely removed by isotropic etching. In addition, a top portion of the exposed substrate 100 is etched, thereby forming a second trench 155 having a first depth h1. The second trench 155 may form a local shallow trench isolation (LSTI).

The isotropic etching may be performed using a dry etching process or a wet etching process. The dry etching process may be based on physical removal, such as a glow discharging process, chemical reaction, such as a plasma etching process, or a combination thereof, such as a reactive ion etching process.

The dry etching process may be performed using at least one of fluorine (F), chlorine (Cl), and bromine (Br).

For example, the isotropic etching may be performed using a chemical dry etching process. During the chemical dry etching process, a fluorine-based gas, e.g., $CF_4$ gas or $CHF_3$ gas, may be used as an etchant gas. Since the chemical dry etching process is performed in the absence of bias to a rear surface of the substrate 100, the gas injected into a process chamber is not directional, thereby forming an isotropic etching profile, as shown in a region indicated by reference symbol A.

For example, in a case where silicon (Si) is subjected to plasma etching, gases including chlorine (Cl) and/or fluorine (F) may be used. Patterning based on the plasma etching is performed through five steps: (1) reactive species are generated in a plasma state; (2) the reactive species are diffused to a surface of a material to be etched; (3) the reactive species are absorbed from the surface of the material to be etched; (4) a chemical reaction takes place to produce volatile byproducts; and (5) the byproducts are emitted from the surface of the material to be etched. The wet etching process may be performed using a wet etching solution having a good etch rate to improve an isotropic etching ratio. However, the wet etching process may have poor etching uniformity compared to the chemical dry etching process.

In addition, the dry etching process may be performed using a capacitively coupled plasma (CCP) type, inductively coupled plasma (ICP) type or electron cyclotron resonance (ECR) equipment.

The isotropic etching may be performed using a wet etching process. The wet etching process may be performed using a chemical etchant including SCI, $NH_4OH$, KOH, or TMAH, but aspects of the present inventive concept are not limited thereto.

Referring to FIGS. 1 and 8C, after the isotropic etching, a third trench 157 is formed in the substrate 100 by anisotropic etching (S140). The anisotropic etching may be performed using a dry etching process.

During the anisotropic etching process, fluorine-based gas (e.g., CF4 or CHF3 gas) or argon (Ar) gas may be used as an etchant gas. Unlike in the isotropic etching process, in the anisotropic etching process, a bias is applied to the rear surface of the substrate 100 to cause active etchant gas to directionally travel to the substrate 100 along an electric field formed by the bias. As the result, the gas injected into the process chamber is accelerated toward the substrate 100, thereby forming the third trench 157 having a second depth h2. The second depth h2 may be greater than the first depth h1. The third trench 157 is formed by etching the substrate 100 using the isolation layer 130 as a etch mask. For example, the substrate 100 exposed by the second trench 155 is subjected to the anisotropic etching process, thereby forming the third trench 157.

Figure 9:
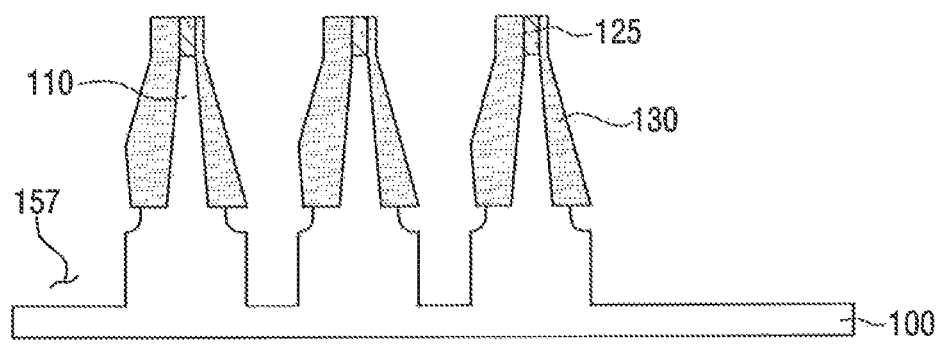

Referring to FIGS. 1 and 9, the isotropic etching and the anisotropic etching sequentially performed remove the remaining portion 115, forming the third trench 157 in the substrate 100. The third trench 157 may serve as a deep trench isolation (DTI).

Although not shown, a gate may be formed on the resulting structure of FIG. 9. For example, the gate may cross over a plurality of trenches, covering sidewalls and top portions of the plurality of trenches. In addition, a source region and a drain region may be formed by injecting N- or P-type impurity to both sides of the active fins 110 exposed by the gate. For example, the active fins 110 may be used in forming FinFETs, but aspects of the present inventive concept are not limited thereto.

Figure 10:
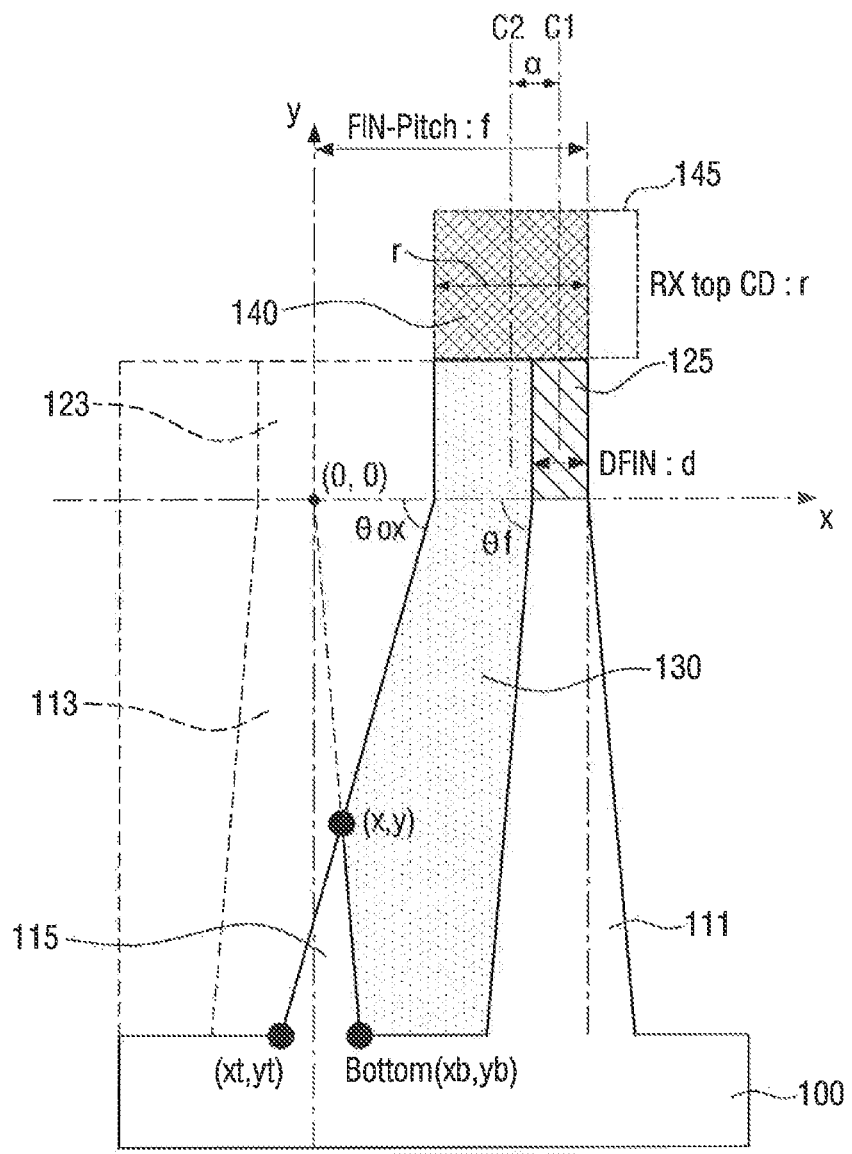

Referring to FIG. 10, the remaining portion 115 of the second active fin 113 is illustrated by enlarging the first region 300 shown in FIG. 7. The first active fin 111 and the second active fin 113 are spaced apart from each other at a fin pitch f. The fin pitch f is a distance between a right top end of the first active fin 111 and a right top end of the second active fin 113.

The first active fin 111 has sectional areas gradually increasing downwardly. The first active fin 111 has a sloped sidewall having a second angle $\theta f$ with respect to a direction x. The sloped sidewall of the first active fin 111 is extended from the top surface of the first active fin 111 to the lateral surface of the first active fin 111. The second angle $\theta f$ may be an acute angle. For example, the second angle $\theta f$ may be smaller than 87 degrees. The other of the plurality of active fins 110 may have the same shape as the first active fin 111.

The hard mask pattern 125 is in contact with the top surface of the first active fin 111. The hard mask pattern 125 has a thickness d having the same sectional area with the top surface of the first active fin 111.

The isolation layer 130 is formed to cover the sidewalls of the first active fin 111 and the hard mask pattern 125. A top surface of the isolation layer 130 is coplanar with a top surface of the hard mask pattern 125 by a planarization process such as, for example, a CMP process.

The mask pattern 140 is formed on the hard mask pattern 125. For example, the mask pattern 140 is in contact with the top surface of the isolation layer 130 and the hard mask pattern 125. The mask pattern 140 completely overlaps the first active fin 111. The mask pattern 140 completely overlaps the first active fin 111 without overlapping the second active fin 113, but aspects of the present inventive concept are not limited thereto. For example, the mask pattern 140 may completely overlap the plurality of active fins 110.

The centerline C2 of the mask pattern 140 does not coincide with the centerline C1 of the first active fin 111. For example, the centerline C2 of the mask pattern 140 is spaced apart from the centerline C1 of the first active fin 111 at a distance a. Such distance may cause the spike of the remaining portion 115 of the second active fin 113 in the forming of the first trench 150.

When a etching process is performed using the mask pattern 140 as an etch mask, the isolation layer 130 is formed to have a sidewall having a third angle θox with respect to a direction x. The sidewall of the isolation layer 130 is extended downwardly from a boundary between the hard mask pattern 125 and the active fin 110. For example, the sidewall of the isolation layer 130 is extended from a plane including the top surface of the first active fin 111 to the lateral surface of the isolation layer 130. The third angle θox may be an acute angle. For example, the third angle θox may be smaller than 84 degrees, but aspects of the present inventive concept are not limited thereto.

In addition, when the etching is performed using the mask pattern 140 as an etch mask, the remaining portion 115 of the second active fin 113 is produced. The remaining portion 115 has the form of a spike.

The size of the remaining portion 115 is defined using the x-y coordinate system having a right top vertex of the second active fin 113 as the origin.

The remaining portion 115 protrudes from the substrate 100, having a triangle shape. In the remaining portion 115, the vertex farthest from the substrate 100 is (x, y). The left vertex of the remaining portion 115 adjacent to the substrate 100 is (xt, yt). The right vertex of the remaining portion 115 adjacent to the substrate 100 is (xb, yb).

The vertex (x, y) of the remaining portion 115 is calculated using the following equations (1) and (2), but aspects of the present inventive concept are not limited thereto.

$$x = \frac{\tan\theta_{ox}}{\tan\theta_{ox} + \tan\theta_f}\left(f - \frac{r}{2} - \frac{d}{2} - \alpha\right) \quad (1)$$

$$y = -\frac{\tan\theta_{ox}\tan\theta_f}{\tan\theta_{ox} + \tan\theta_f}\left(f - \frac{r}{2} - \frac{d}{2} - \alpha\right) \quad (2)$$

where θox is a third angle of the isolation layer 130, θf is a second angle of the first active fin 111, f is a fin pitch between each of the plurality of active fins 110, r is a width of the mask pattern 140, d is a width of the hard mask pattern 125, and α is a difference between the centerline C2 of the mask pattern 140 and the centerline C1 of the first active fin 111.

Referring to FIG. 11, a table having the size of the remaining portion 115 depending on the difference α of FIG. 10 is illustrated. In the table shown in FIG. 11, x, y and xt are represented using nm units.

The table shown in FIG. 11 indicates how much the remaining portion 115 increases as the difference α increases. The difference α increases by 1 nm. The vertex (x, y) of the remaining portion 115 is calculated using the equations (1) and (2). A lateral etch target means an area (nm²) of the remaining portion 115 of the second active fin 113. The greater the difference α, the larger the area of the remaining portion 115. The table shown in FIG. 11 is provided just by way of experimental example, but aspects of the present inventive concept are not limited thereto.

Hereinafter, a method for fabricating a semiconductor device according to an exemplary embodiment of the present inventive concept will be described with reference to FIGS. 12 to 13C. For the convenience of description, description of the same elements as in the above embodiment will be omitted.

Figure 12:
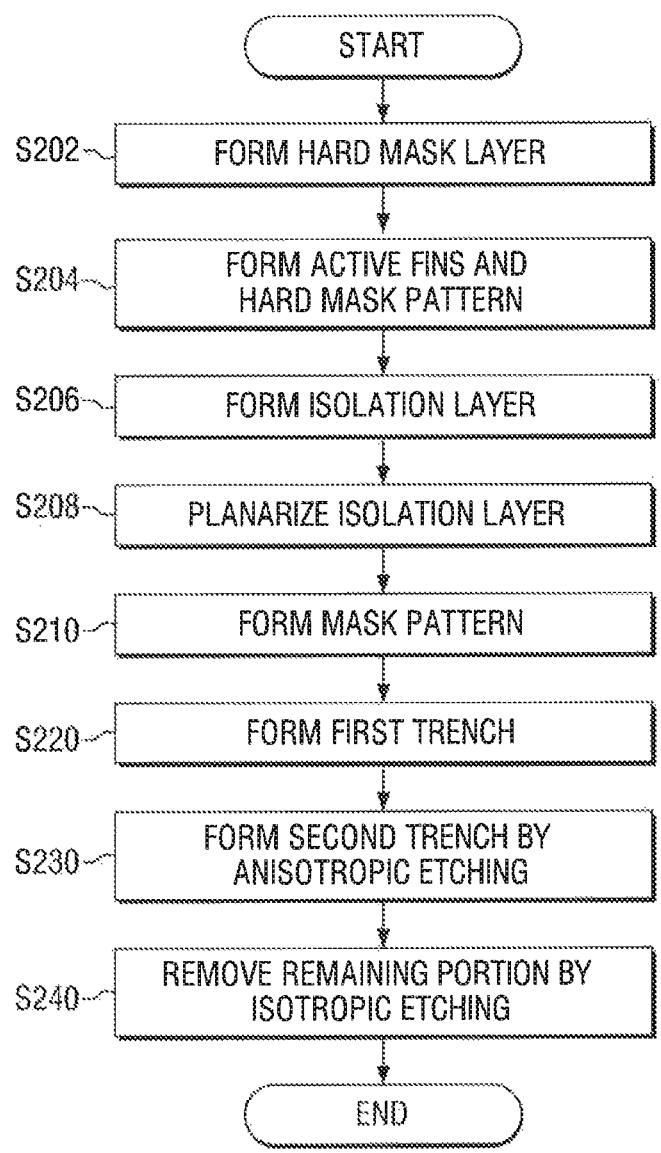
FIG. 12 is a flowchart illustrating a method for fabricating a semiconductor device according to an exemplary embodiment of the present inventive concept.
Figure 13B:
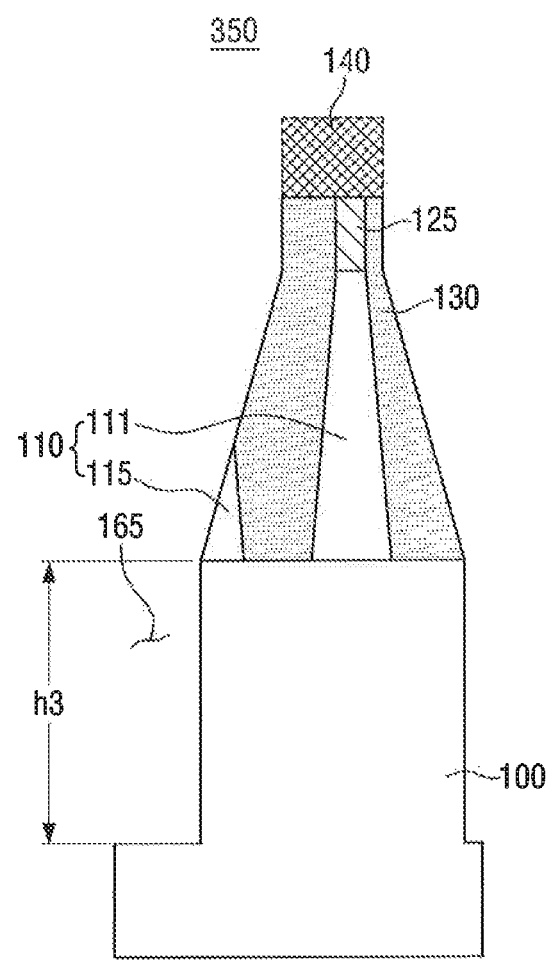
Figure 13C:
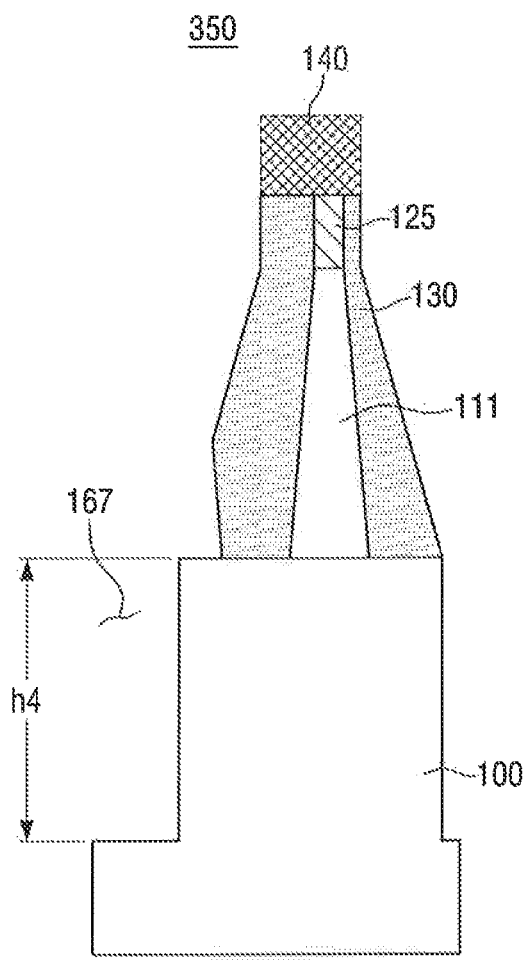

FIG. 12 is a flowchart illustrating a method for fabricating a semiconductor device according to an exemplary embodiment of the present inventive concept, and FIGS. 13A to 13C illustrate intermediate process steps for a method for fabricating a semiconductor device according to an exemplary embodiment of the present inventive concept.

Referring to FIG. 12, a hard mask layer 120 is formed on a substrate 100 (S202). Next, a plurality of active fins 110 and a hard mask pattern 125 are formed by etching the substrate 100 and the hard mask layer 120 (S204). Next, an isolation layer 130 filling lateral surfaces of the plurality of active fins 110 and the hard mask pattern 125 is then formed (S206). Next, the isolation layer 130 is planarized (S208). Next, a mask pattern 140 positioned on the hard mask pattern 125 and the first active fin 111 is formed (S210). Next, a first trench 150 is formed using the mask pattern 140 as a etch mask (S220). The steps S202 to S220 of the present exemplary embodiment are substantially the same as the steps S102 to S120 of the previous embodiment.

FIGS. 13A to 13C are enlarged views of a second region 350 that is substantially the same as the first region 300 shown in FIG. 7. FIG. 13A illustrates the resulting structure of the steps S202 to S220. The resulting structure of FIG. 13A is substantially the same as that of FIG. 8A.

Referring to FIGS. 12 and 13B, a second trench 165 is formed in the substrate 100 by an anisotropic etching process (S230). The anisotropic etching process may include a dry etching process. The anisotropic etching in step S230 may be performed in substantially the same manner with the anisotropic etching shown in FIG. 8C. The second trench 165 has a third depth h3.

The substrate 100 may include a material having different etching selectivity from the first and second active fins 110, but aspects of the present inventive concept are not limited thereto. For example, the substrate 100 and the plurality of active fins 110 may include the same material.

During the anisotropic etching process, only the substrate 100 is etched without etching the remaining portion 115 of the second active fin 113. The anisotropic etching process is performed using the isolation layer 130 and the remaining portion 115 of the second active fin 113 as etch masks. The second trench 165 may serve as a deep trench isolation (DTI).

Referring to FIGS. 12 and 13C, after the anisotropic etching process, the remaining portion 115 of the second active fin 113 is removed by an isotropic etching process (S240). The isotropic etching is performed after the anisotropic etching. The isotropic etching process may include a dry etching process or a wet etching process. The isotropic etching in step S240 may be performed in substantially the same manner with the isotropic etching shown in FIG. 8B.

The substrate 100 may include a material having different etching selectivity from the first and second active fins 110. In this case, during the anisotropic etching process, only the remaining portion 115 of the second active fin 113 is etched without etching the substrate 100. A fourth depth h4 of the third trench 157 formed on the substrate 100 may be substantially equal to the third depth h3 of the second trench 165, but aspects of the present inventive concept are not limited thereto.

Although not shown, when the substrate 100 and the plurality of active fins 110 include the same material, the fourth depth h4 may be greater than the third depth h3, because the substrate 100 is etched in the isotropic etching process.

Hereinafter, a method for fabricating a semiconductor device according to an exemplary embodiment of the present inventive concept will be described with reference to FIGS. 14 to 17. For the convenience of description, description of the same elements as in the above embodiment will be omitted.

Figure 14:
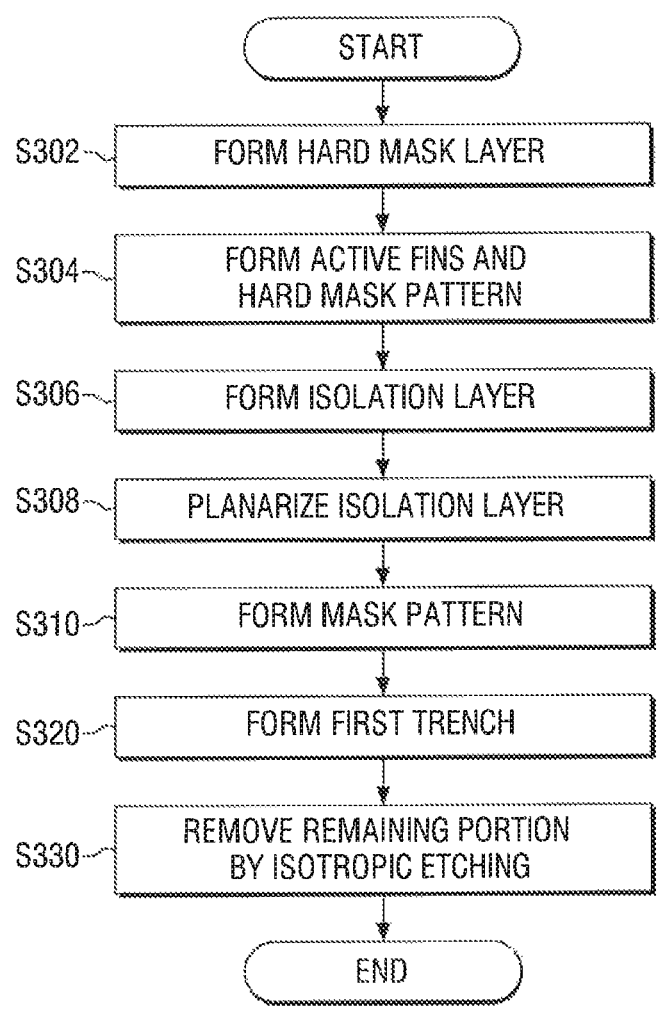
FIG. 14 is a flowchart illustrating a method for fabricating a semiconductor device according to an exemplary embodiment of the present inventive concept.
Figure 15:
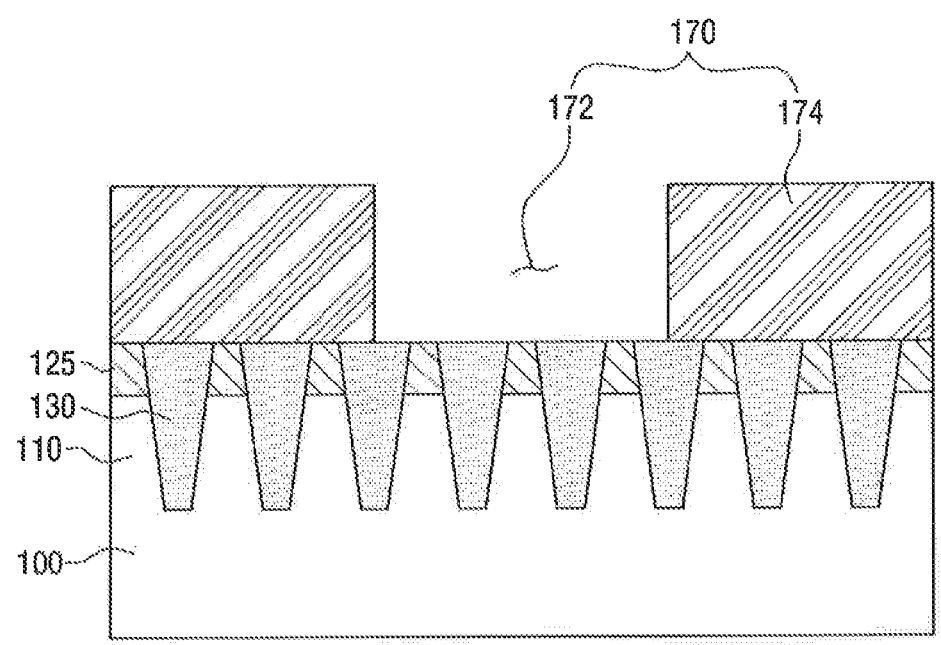
FIGS. 15 to 17 illustrate intermediate process steps for a method for fabricating a semiconductor device according to an exemplary embodiment of the present inventive concept.
Figure 16:
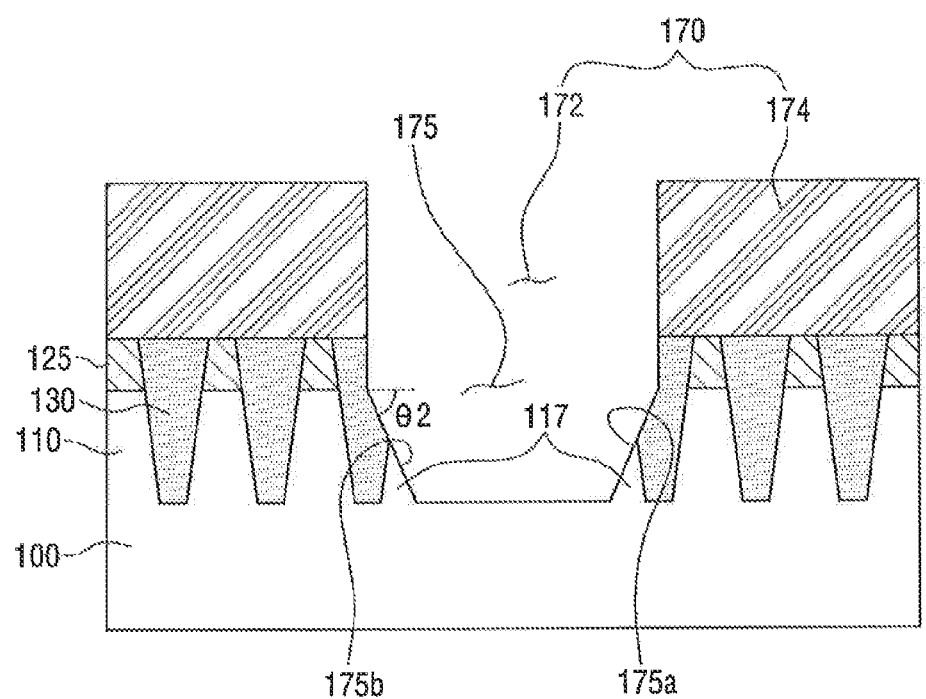
Figure 17:
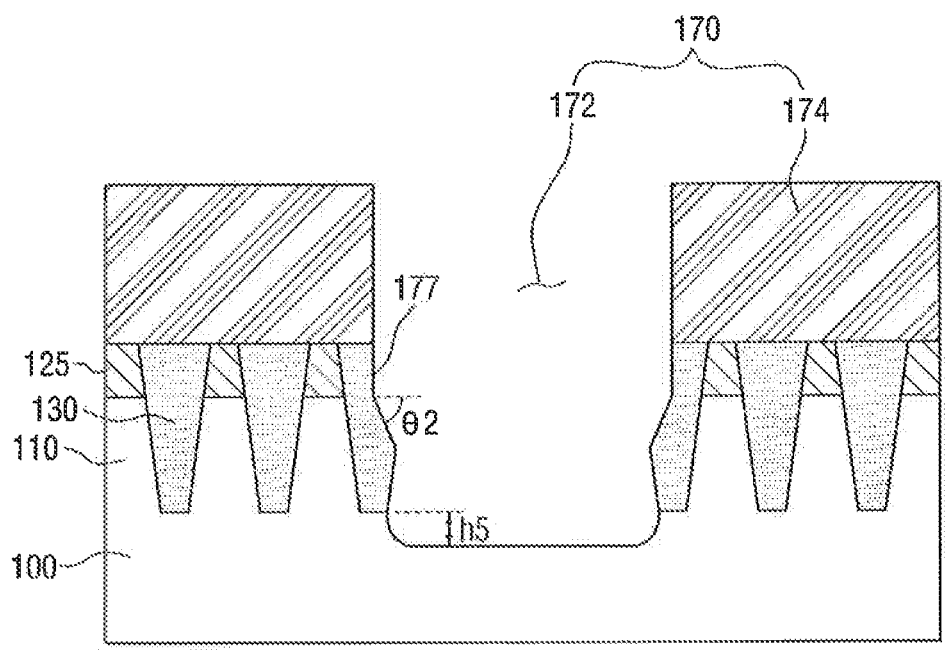

FIG. 14 is a flowchart illustrating a method for fabricating a semiconductor device according to an exemplary embodiment of the present inventive concept, and FIGS. 15 to 17 illustrate intermediate process steps for a method for fabricating a semiconductor device according to an exemplary embodiment of the present inventive concept.

Referring to FIG. 14, a hard mask layer 120 is formed on a substrate 100 (S302). Next, a plurality of active fins 110 and a plurality of hard mask patterns 125 are formed by etching the substrate 100 and the hard mask layer 120 (S304). Next, an isolation layer 130 filling lateral surfaces of the plurality of active fins 110 and the plurality of hard mask patterns 125 is then formed (S306). Next, the isolation layer 130 is planarized (S308). The steps S302 to S308 of the present exemplary embodiment may be substantially the same as the steps S102 to S108 of the previous embodiment. FIG. 15 illustrates the resulting structure of the steps S302 to S308.

Referring to FIGS. 14 and 15, a mask pattern 170 is formed on the resulting structure of the steps S302 to S308 (S310). The resulting structure of FIG. 13 is substantially the same as that of FIG. 5, except for the mask pattern 170. The mask pattern 170 is positioned on the plurality of hard mask patterns 125 and overlaps at least two first active fins 110. The mask pattern 170 includes an opening 172.

For example, the mask pattern 170 completely overlaps at least two active fins 110. The opening 172 of the mask pattern 170 exposes at least two hard mask patterns 125.

Referring to FIGS. 14 and 16, a first trench 175 is formed using the mask pattern 170 as a etch mask (S320). The first trench 175 is formed by etching the active fins 110 exposed by the opening 172 and the isolation layer 130. The first trench 175 exposes a top surface of the substrate 100. The exposed active fins 110 are not completely etched, and remaining portions 117 of the exposed active fins 110 are produced.

The first trench 175 is formed to include a vertical sidewall 175a and a sloped sidewall 175b. The first trench 175 is formed to include a vertical sidewall 175a and a sloped sidewall 175b. The sloped sidewall 175b is sloped at a second angle θ2 with respect to an imaginary line perpendicular to the vertical sidewall 175a. The area of the first trench 175 decreases downwardly toward a lower portion of the first active fin 111. The second angle θ2 may be an acute angle or a right angle with respect to the imaginary line.

The remaining portions 117 have a spike shape. The remaining portions 117 may correspond to defects of a semiconductor product, adversely affecting the performance of the semiconductor product and lowering the reliability of the semiconductor product.

The remaining portions 117 of the exposed active fins 110 may be produced when a fin pitch between two neighboring active fins 110 is about 40 nm or less. Here, the remaining portions 117 have a dimension of about 20 nm or less, but aspects of the present inventive concept are not limited thereto.

Referring to FIGS. 14 and 17, the remaining portions 117 of the exposed active fins 110 are removed by an isotropic etching process (S330). A top surface of the exposed substrate 100 is isotropically etched, thereby forming a round recess on the substrate 100. As the result of the isotropic etching, an undercut is formed on the substrate 100 positioned under the isolation layer 130.

The remaining portions 117 of the exposed active fins 110 may be removed by an isotropic etching process. In addition, a top portion of the exposed substrate 100 is etched, thereby forming a second trench 177 deeper than the first trench 175 by a fifth depth h5. The second trench 177 may serve as a local shallow trench isolation (LSTI).

The isotropic etching may be performed using a dry etching process or a wet etching process. The isotropic etching in step S330 may be performed in substantially the same manner with the isotropic etching shown in FIG. 8B.

Hereinafter, a method for fabricating a semiconductor device according to an exemplary embodiment of the present inventive concept will be described with reference to FIGS. 18 to 24. For the convenience of description, description of the same elements as in the above embodiment will be omitted.

FIGS. 18 to 24 illustrate intermediate process steps for a method for fabricating a semiconductor device according to an exemplary embodiment of the present inventive concept.

Figure 18:
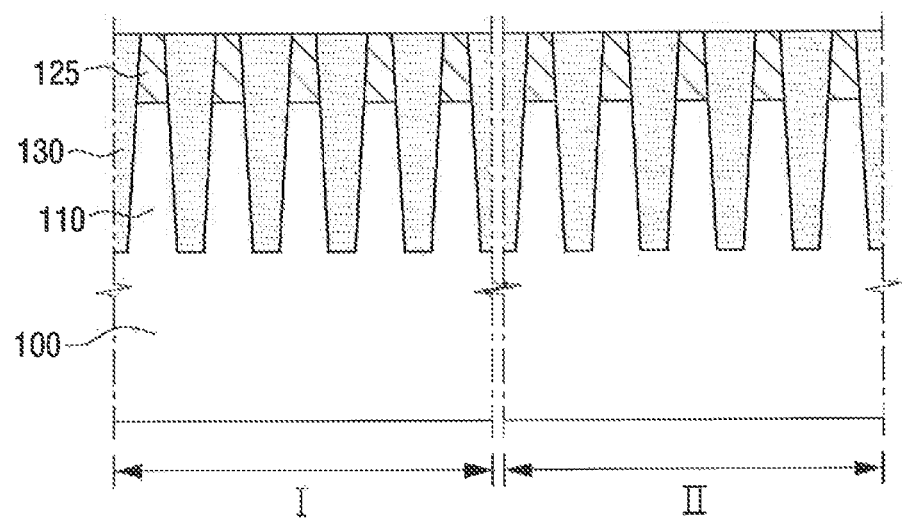
FIGS. 18 to 24 illustrate intermediate process steps for a method for fabricating a semiconductor device according to an exemplary embodiment of the present inventive concept.

Referring to FIG. 18, a substrate 100 having a first region I and a second region II is provided. The first region I and the second region II are separated from each other or connected to each other.

Active fins 110 and hard mask patterns 125 are formed on the substrate 100 of the first region I and the second region II. The isolation layer 130 is formed to fill lateral surfaces of the active fins 110 and the hard mask patterns 125, and a top surface of the isolation layer 130 is coplanar with top surfaces of the hard mask patterns 125.

Figure 19:
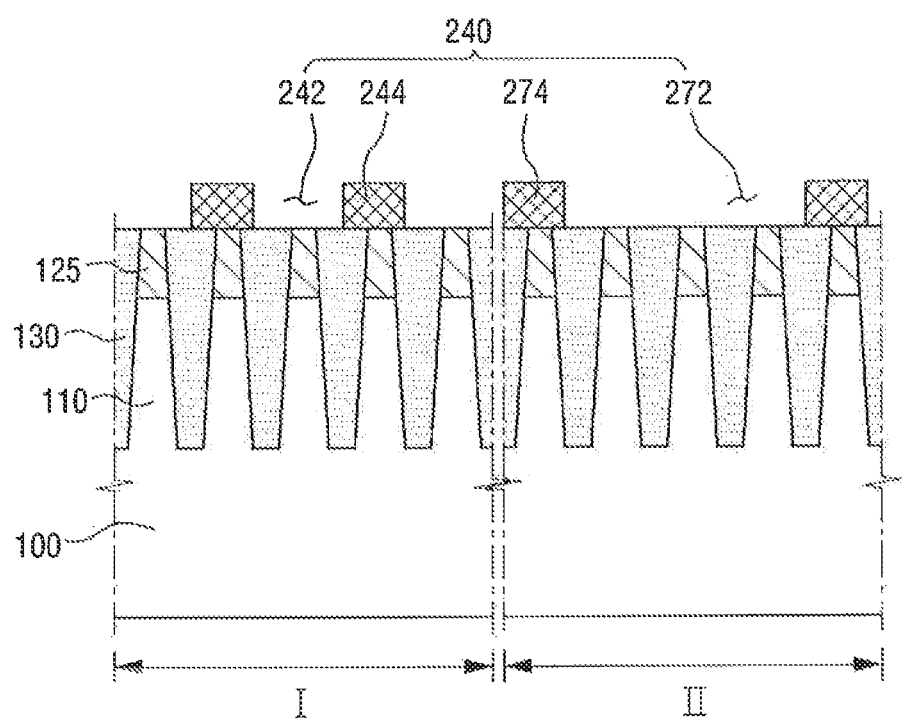

Referring to FIG. 19, a first mask pattern 240 is formed on the first region I and the second region II (S310). The mask pattern 240 includes line patterns 244 and 274 and openings 242 and 272. In the first region, the line patterns 244 and the openings 242 are alternately arranged such that one active fin 110 is disposed under the opening 242. The first mask pattern 240 of the first region I is positioned on the hard mask patterns 125 and the isolation layer 130 such that one active fin 110 is disposed under the opening 242. The line patterns 244 and the openings 242 extend in parallel to each other along the first active fin 110.

In the second region II, the line patterns 274 and the openings 272 are alternately arranged such that three active fins 110 are disposed under the opening 272. For the convenience of description, the number of active fins 110 disposed under the opening 242 in the first region I is one, and the number of active fins 110 disposed under the opening 272 is three. The numbers of active fins 110 under the openings 242 and 272 may be at least one and may be different from each other.

Figure 20:
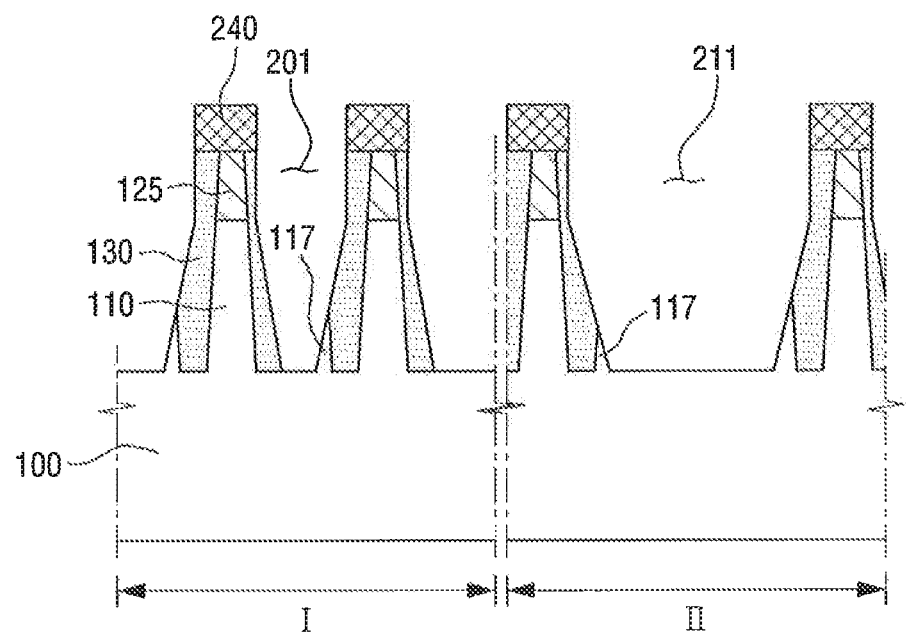

Referring to FIG. 20, a first trench 201 is formed on the first region I using the first mask pattern 240 as a etch mask, and a second trench 211 is formed on the second region II. The first and second trenches 201 and 211 are formed by etching the active fins 110 disposed under the openings 242 and 272 of the first mask pattern 240. The first trench 201 exposes a top surface of the substrate 100. The exposed active fins 110 are not be completely etched, and thus remaining portions 117 of the exposed active fins 110 are produced after the forming of the first trench 201.

The remaining portions 117 of the exposed active fins 110 has a spike shape. The remaining portions 117 may be produced if a fin pitch between two neighboring active fins 110 is about 40 nm or less. The fin pitch size may be varied according to a etching condition for forming the trenches 201 and 202.

Figure 21:
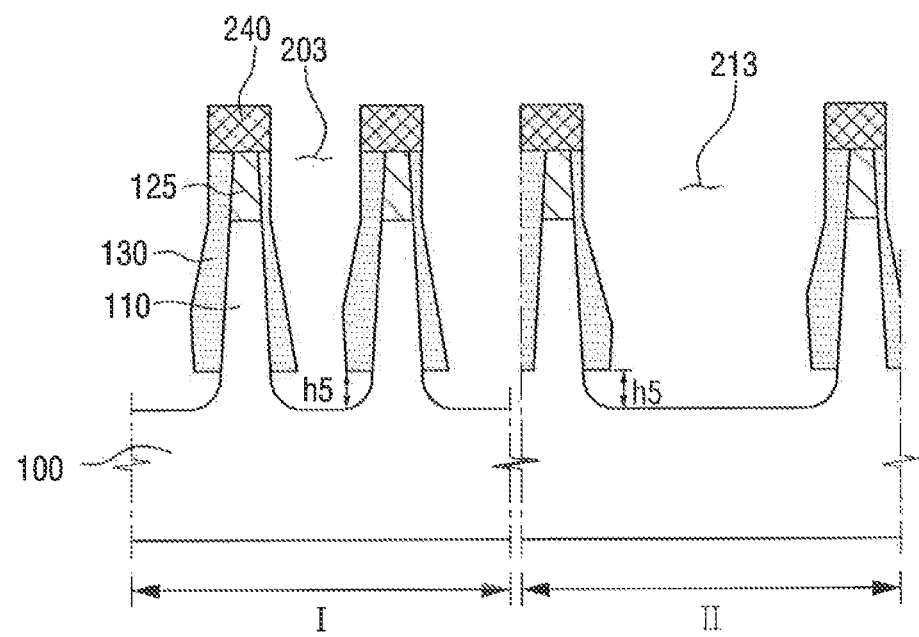

Referring to FIG. 21, isotropic etching is performed on the first region I and the second region II. The remaining portions 117 are removed by an isotropic etching process. In addition, a round recess is formed on a top portion of the exposed substrate 100 in the isotropic etching process. As the result of the isotropic etching, an undercut under the isolation layer 130 is formed on the substrate 100.

In the isotropic etching process, the top portion of the exposed substrate 100 is etched, thereby forming third and fourth trenches 203 and 213 that are deeper than the first and second trenches 201 and 211 by a fifth depth h5. The fourth trench 213 may serve as a local shallow trench isolation (LSTI).

The isotropic etching may be performed using a dry etching process or a wet etching process. Here, the isotropic etching may be performed in substantially the same manner with the isotropic etching shown in FIG. 8B.

Figure 22:
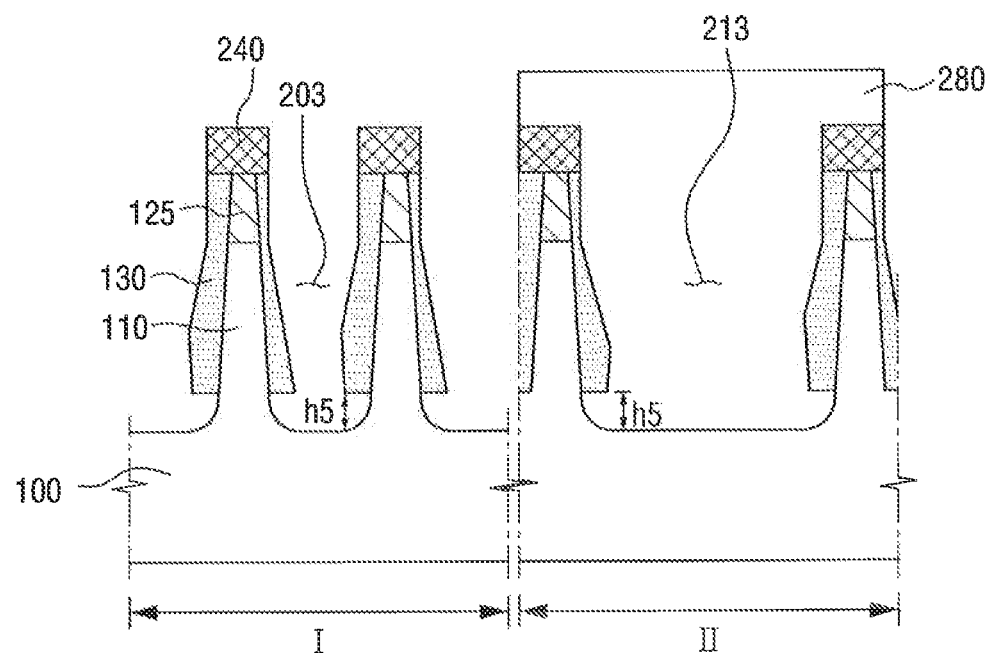

Referring to FIG. 22, a second mask pattern 280 is formed on the second region II.

For example, the second mask pattern 280 covers only the second region II while exposing the first region I. The second mask pattern 280 may be performed after performing the isotropic etching process and before performing an anisotropic etching process. The anisotropic etching process will be described.

Figure 23:
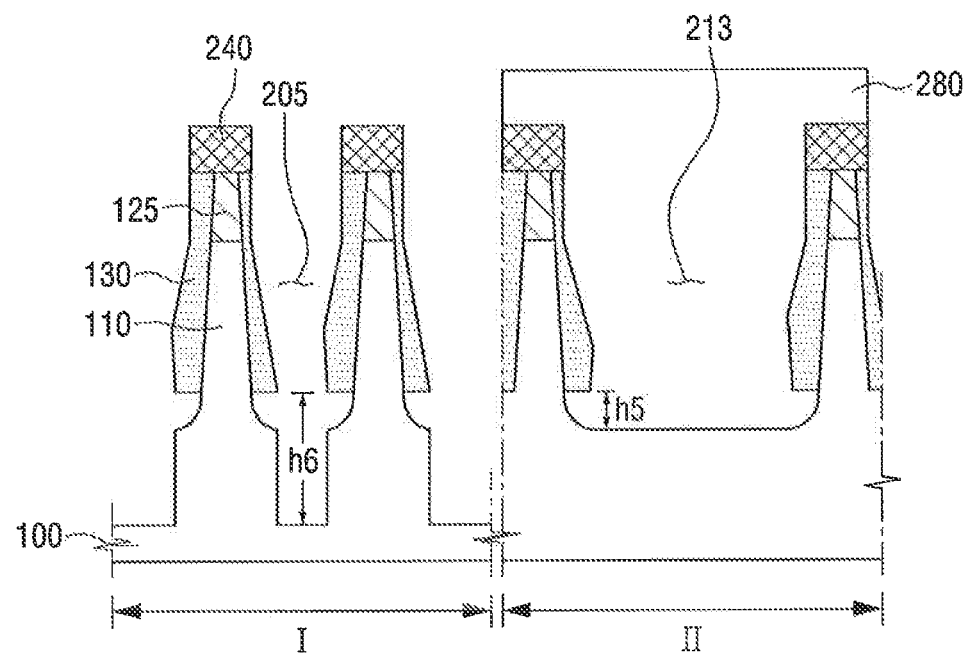

Referring to FIG. 23, after the isotropic etching, a fifth trench 205 is formed on the substrate 100 of the first region I by the anisotropic etching process. For example, regions exposed by the first and second mask patterns 240 and 280 are target regions of the anisotropic etching process. The fourth trench 213 of the second region II is protected from the anisotropic etching process by the second mask pattern 280.

Using the isotropic etching and anisotropic etching processes, the remaining portions 117 in the first region I is removed, and the fifth trench 205 is formed on the substrate 100. The fifth trench 205 is deeper than the first trench 201 by a sixth depth h6. The fifth trench 205 may serve as a deep trench isolation (DTI) process.

Figure 24:
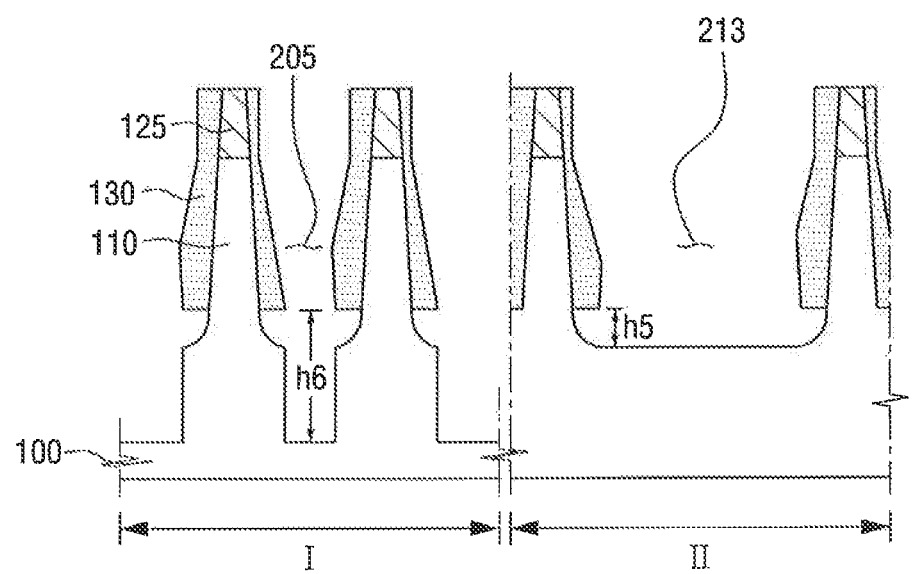

Referring to FIG. 24, the first and second mask patterns 240 and 280 are removed. Consequently, the remaining portions 117 existing on the first region I and the second region II are removed. In addition, the fifth trench 205 of the sixth depth h6 is formed on the first region I and the fourth trench 213 of the fifth depth h5 is formed on the second region II.

Hereinafter, a method for fabricating a semiconductor device according to an exemplary embodiment of the present inventive concept will be described with reference to FIGS. 25 to 28. For the convenience of description, description of the same elements as in the above embodiment will be omitted.

FIGS. 25 to 28 illustrate intermediate process steps for a method for fabricating a semiconductor device according to an exemplary embodiment of the present inventive concept.

Figure 25:
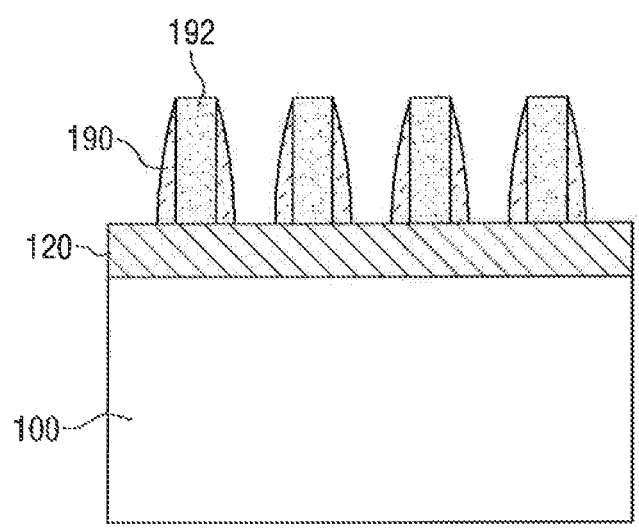
FIGS. 25 to 28 illustrate intermediate process steps for a method for fabricating a semiconductor device according to an exemplary embodiment of the present inventive concept.

Referring to FIG. 25, a hard mask layer 120 is formed on a substrate 100 and a sacrificial layer pattern 192 is formed thereon. The sacrificial layer pattern 192 may be used in a double patterning technology (DPT) process or a spacer patterning technology (SPT) process. The sacrificial layer pattern 192 may be removed after performing the DPT or SPT process. The sacrificial layer pattern 192 may include at least one of poly Si, $Si_3N_4$, $SiO_2$ and carbon-based material.

Next, a spacer 190 is formed on both sidewalls of the sacrificial layer pattern 192 using an etch back process. The etch back process may be performed using an anisotropic dray etching process in a plasma etch equipment. For example, the etch back process may use an etchant gas such as $Cl_2$, HBr or a combination thereof having high etch selectivity for the sacrificial layer pattern 192.

Figure 26:
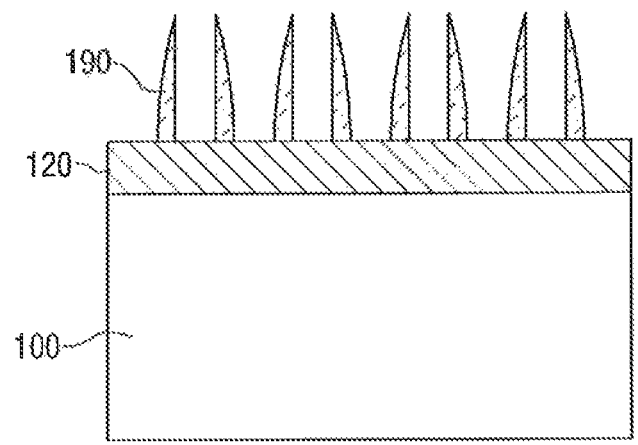

Referring to FIG. 26, after forming the spacer 190, the sacrificial layer pattern 192 is removed. If the sacrificial layer pattern 192 is removed, the hard mask layer 120 positioned under the sacrificial layer pattern 192 is exposed.

Figure 27:
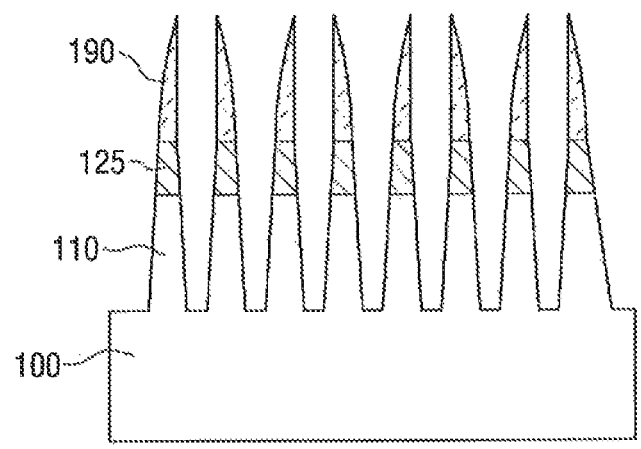

Referring to FIG. 27, active fins 110 and hard mask patterns 125 are formed by etching the substrate 100 and the hard mask layer 120. For example, the active fins 110 and the hard mask patterns 125 formed on the substrate 100 shown in FIG. 27 are formed using the spacer 190 as a etch mask. Here, the etching process may be performed using a etch back process. The etch back process may be performed using an anisotropic dray etching process in a plasma etch equipment. Aspects of the present inventive concept are not limited thereto.

Figure 28:
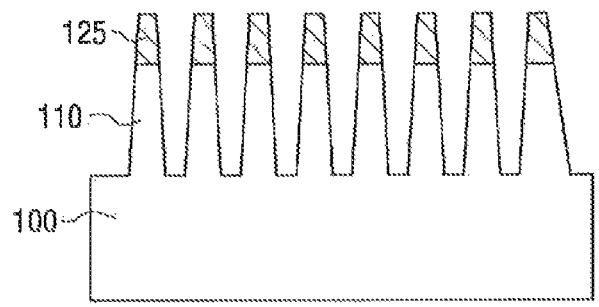

Referring to FIG. 28, the spacer 190 disposed on the hard mask patterns 125 is removed. Subsequent process steps may be performed by substantially the same manner with those of the previous embodiments shown in FIGS. 4 to 24. Specifically, when the DPT or SPT process is employed, the integration level of semiconductor devices may be increased two or more times, compared to a case when the conventional process is used.

Figure 29:
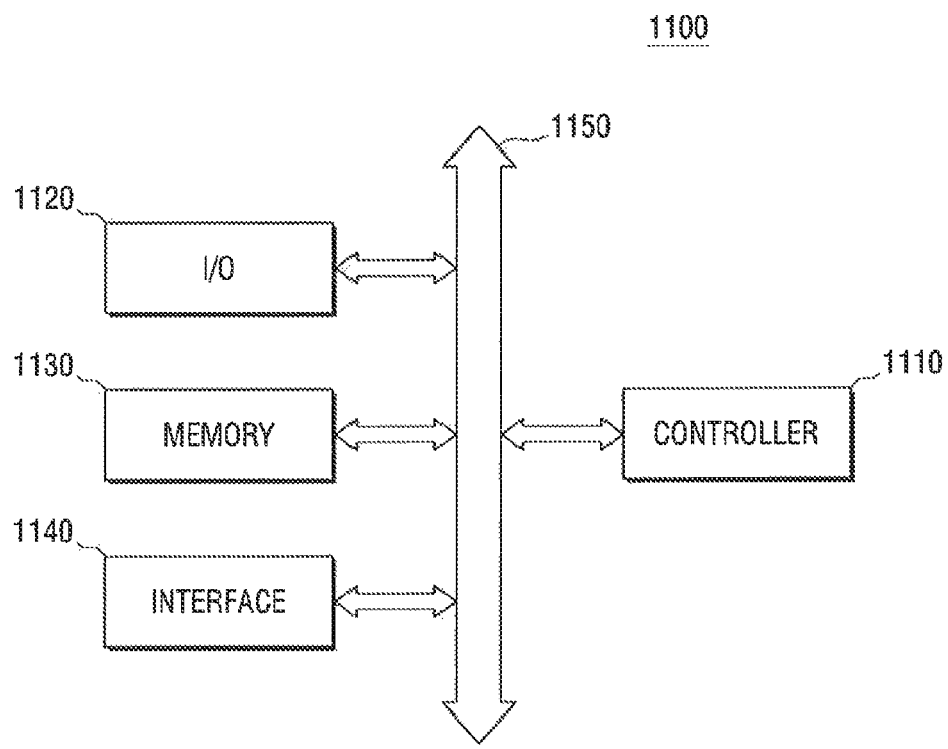
FIG. 29 is a block diagram of an electronic system including a semiconductor device according to an exemplary embodiment of the present inventive concept.

FIG. 29 is a block diagram of an electronic system including a semiconductor device according to an exemplary embodiment of the present inventive concept.

Referring to FIG. 29, the electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include a high-speed dynamic random access memory (DRAM) device and/or a static random access memory (SRAM) device as a working memory for improving the operation of the controller 1110. The memory device 1130, the controller 1110 and/or the I/O 1120 may include a semiconductor device according to an exemplary embodiment of the present inventive concept.

The electronic system 1100 be applied to a personal digital assistant (PDA), a portable computer, a web tablet, a wireless phone, a mobile phone, a digital music player, a memory card, or any type of electronic device capable of transmitting and/or receiving information in a wireless environment.

Figure 30:
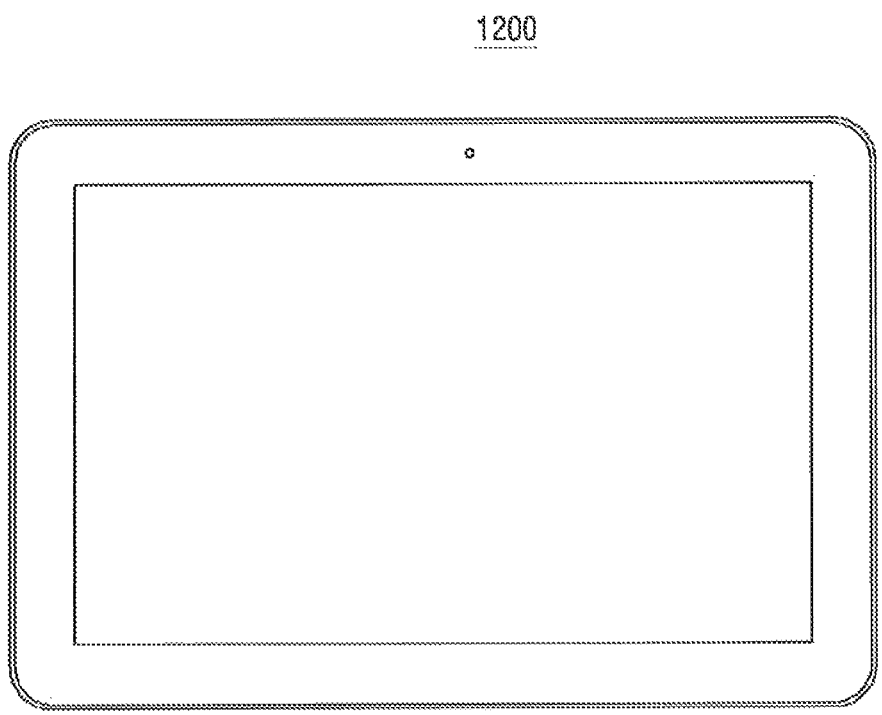
FIG. 30 illustrates an exemplary semiconductor system including a semiconductor device according to an exemplary embodiment of the present inventive concept.

FIG. 30 illustrates exemplary semiconductor systems including a semiconductor device according to an exemplary embodiment of the present inventive concept. FIG. 30 illustrates an exemplary tablet PC or an exemplary notebook including a semiconductor device according to an exemplary embodiment. At least one semiconductor devices according to an exemplary embodiment of the present inventive concept may be employed to a tablet PC, a notebook computer, and the like. Other IC devices not illustrated herein may include a semiconductor device according to an exemplary embodiment.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for fabricating a semiconductor device, the method comprising:
    forming first and second hard mask patterns adjacent to each other on a substrate;
    forming first and second active fins by etching the substrate using the first and second hard mask patterns as an etch mask;
    forming an isolation layer filling a region defined by the first and second active fins and the first and second hard mask patterns;
    forming a mask pattern positioned on the first hard mask pattern and overlapping the first active fin;
    forming a first trench by etching a portion of the isolation layer and a portion of the second active fin using the mask pattern as an etch mask; and
    removing a remaining portion of the second active fin by performing an isotropic etching process.

2. The method of claim 1, further comprising:
    forming a second trench by performing the isotropic etching process through the first trench; and
    forming a third trench by performing an anisotropic etching through the second trench,
    wherein the third trench is deeper than the second trench and wherein the isotropic etching process is performed prior to the anisotropic etching process.

3. The method of claim 1, further comprising:
    forming a second trench by performing an isotropic etching process through the first trench, wherein an anisotropic etching process is performed prior to the isotropic etching process.

4. The semiconductor device of claim 3, wherein the substrate includes a material having etching selectivity with respect to the first and second active fins in the anisotropic etching process.

5. The method of claim 1, wherein the isotropic etching process is performed using a dry etching process or a wet etching process.

6. The method of claim 5, wherein the dry etching process is performed using fluorine (F), chlorine (Cl), or bromine (Br) as a etchant.

7. The method of claim 5, wherein the dry etching process is performed using a plasma-generating equipment including at least one of a capacitively coupled plasma (CCP) equipment, an inductively coupled plasma (ICP) equipment and an electron cyclotron resonance (ECR) plasma equipment.

8. The method of claim 5, wherein the wet etching process is performed using SC1, $NH_4OH$, KOH, or TMAH as an etchant.

9. The method of claim 5, wherein the mask pattern includes an opening exposing the second hard mask pattern.

10. The method of claim 2, wherein a local shallow trench isolation (STI) trench is formed by forming a second trench.

11. The method of claim 1, wherein the mask pattern includes a plurality of line patterns and a plurality of openings extending in parallel to each other along a direction where the first and second active fins extend, wherein one of the plurality of line patterns completely overlaps one of the first and second active fins, and each of the plurality of openings and each of the plurality of line patterns are alternately arranged.

12. The semiconductor device of claim 1, wherein a sidewall of the first trench includes the remaining portion of the second active fin.

13. A method for fabricating a semiconductor device, the method comprising:
    forming a plurality of active fins on first and second regions of a substrate;
    forming a hard mask pattern disposed on top surfaces of the plurality of active fins;
    forming an isolation layer filling a region disposed between two neighboring active fins of the plurality of active fins;
    forming a first mask pattern including a plurality of first line patterns, a first opening, a plurality of second line patterns and a second opening,
    wherein the plurality of first line patterns and the first opening are disposed on the first region,
    wherein the first opening is disposed between two neighboring first line patterns of the plurality of first line patterns,
    wherein the plurality of second line patterns and the second opening are disposed on the second region,
    wherein the second opening is disposed between two neighboring second line patterns of the plurality of second line patterns,
    wherein the plurality of first and second line patterns is positioned on the hard mask pattern,
    wherein the plurality of first line patterns overlaps first portions of the plurality of active fins and the first opening overlaps second portions of the plurality of active fins, and
    wherein the plurality of second line patterns overlaps third portions of the plurality of active fins and the second opening overlaps fourth portions of the plurality of active fins;
    forming a first trench and a second trench by partially etching the second and the fourth portions of the plurality of active fins using the first mask pattern as an etch mask, wherein the first trench and the second trench are formed on the first and the second regions, respectively;
    removing the second and the fourth portions of the plurality of active fins remaining after the forming of the first and the second trench by an isotropic etching process;
    forming a second mask pattern covering the second region; and
    forming a third trench through the first trench by an anisotropic etching process using the first mask pattern and the second mask pattern as an etch mask.

14. The method of claim 13, wherein the second mask pattern is formed after performing the isotropic etching process and before performing the anisotropic etching process, and the third trench is deeper than the first and second trenches.

15. The method of claim 14, wherein the isotropic etching process comprises a dry etching process or wet etching process.

16. The method of claim 13, wherein the forming of the plurality of active fins and the hard mask pattern on the substrate comprises:
    forming a hard mask layer on the substrate;
    forming a plurality of spacers on the hard mask layer using a sacrificial insulation layer; and
    forming the plurality of active fins and the hard mask pattern by etching the hard mask layer and the substrate using the plurality of spacers as a etch mask.

17. A method for fabricating a semiconductor device, the method comprising:
- forming a plurality of first active fins and a plurality of second active fins on a substrate;
- forming a mask pattern including a plurality of line patterns and a plurality of openings, wherein each opening is disposed between two neighboring line patterns of the plurality of line patterns, wherein each line pattern overlaps each first active fin and each opening overlaps each second active fin;
- forming a plurality of first trenches by partially etching, using the mask pattern as an etch mask, the plurality of second active fins, wherein the plurality of first active fins is not etched in the forming of the plurality of first trenches; and
- removing a remaining portion of each second active fin using an isotropic etching process.

18. The method of claim 17, wherein each first trench includes a sloped sidewall, and wherein an area of each first trench decreases downwardly.

19. The method of claim 17, wherein a center line of each line pattern does not coincide with a center line of each first active fin.

20. The method of claim 17, further comprising:
- forming a plurality of second trenches by performing the isotropic etching process through the plurality of first trenches, and
- forming a plurality of third trenches by performing an anisotropic etching process through the plurality of second trenches,
- wherein each first trench is connected to each second trench, and wherein each second trench is connected to each third trench.

* * * * *